US007009439B2

(12) United States Patent
Park

(10) Patent No.: US 7,009,439 B2
(45) Date of Patent: Mar. 7, 2006

(54) CIRCUIT AND METHOD FOR GENERATING INTERNAL CLOCK SIGNAL

(75) Inventor: Ki Chon Park, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/736,722

(22) Filed: Dec. 16, 2003

(65) Prior Publication Data

US 2004/0257132 A1 Dec. 23, 2004

(30) Foreign Application Priority Data

Jun. 18, 2003 (KR) ............... 10-2003-0039553

(51) Int. Cl.
*H03K 21/00* (2006.01)
(52) U.S. Cl. ............... 327/291; 327/299
(58) Field of Classification Search ............... 327/291, 327/293, 294, 299, 99, 39, 47, 49, 141, 144, 327/145
See application file for complete search history.

(56) References Cited

U.S. PATENT DOCUMENTS

| 4,982,116 A | * | 1/1991 | Lee ............... 327/144 |
| 5,028,824 A | * | 7/1991 | Young ............... 327/262 |
| 5,136,180 A | * | 8/1992 | Caviasca et al. ............... 327/115 |
| 5,511,209 A | * | 4/1996 | Mensch, Jr. ............... 713/500 |
| 5,751,175 A | * | 5/1998 | Imamura ............... 327/291 |
| 5,808,961 A | | 9/1998 | Sawada ............... 365/233 |
| 5,844,438 A | * | 12/1998 | Lee ............... 327/291 |
| 6,130,571 A | * | 10/2000 | Yamamoto ............... 327/525 |
| 6,166,990 A | | 12/2000 | Ooishi et al. ............... 365/233 |
| 6,310,506 B1 | * | 10/2001 | Brown ............... 327/284 |
| 6,426,671 B1 | * | 7/2002 | Kono ............... 327/541 |
| 6,456,562 B1 | * | 9/2002 | Abedifard ............... 365/233 |
| 6,507,230 B1 | * | 1/2003 | Milton ............... 327/291 |
| 6,784,709 B1 | * | 8/2004 | Ryu ............... 327/172 |

\* cited by examiner

Primary Examiner—Timothy P. Callahan
Assistant Examiner—Hai L. Nguyen
(74) Attorney, Agent, or Firm—Marshall, Gerstein & Borun LLP

(57) ABSTRACT

The present invention relates to a circuit and method for generating an internal clock signal. According to the present invention, it is determined whether an external clock signal is a high frequency or a low frequency. Depending on the determination, the external clock signal is waveform-shaped to generate an internal clock signal or the external clock signal as the internal clock signal as it is. Therefore, rising edge timings of the external clock signal and the internal clock signal become coincident regardless of the frequency of the external clock signal. Reduction in an operating margin within the circuit due to reduction in the pulse width of the internal clock signal is prevented. Thus, the circuit of the present invention can be used in the high frequency and the low frequency at the same time and reliability of the circuit can be improved.

18 Claims, 5 Drawing Sheets

CIRCUIT AND METHOD FOR GENERATING INTERNAL CLOCK SIGNAL

BACKGROUND

1. Field of the Invention

The present invention relates to a circuit and a method for generating an internal clock signal and, more specifically, to a circuit and a method for generating an internal clock signal in a semiconductor memory device, which generates the internal clock signal for synchronizing the operation of the circuit within the semiconductor memory device by using an externally inputted clock signal.

2. Discussion of Related Art

A device that operates in synchronism with a clock signal employs an external clock signal to generate an internal clock signal whose pulse width is constant for the purpose of a stable operation within the circuit.

FIG. 1 is a circuit diagram illustrating a circuit for generating an internal clock signal according to a prior art.

Referring to FIG. 1, the circuit for generating the internal clock signal includes a delay unit 110 and a pulse-shaping unit 120. In the above, the delay unit 110 delays an external clock signal (Ext_CLK) by time corresponding to a desired pulse width. The pulse-shaping unit 120 logically combines a signal (A) that is delayed by given time by the delay unit 110 and the externally inputted clock signal (Ext_CLK) to generate an internal clock signal (Int_CLK) having a target pulse width (for example, pulse width corresponding to delay time performed in the delay unit).

Meanwhile, the pulse-shaping unit 120 includes a first NAND gate N121 for performing a NAND operation for the external clock signal (Ext_CLK) and the delay signal (A) of the delay unit 110, a second NAND gate N122 for performing a NAND operation for the external clock signal (Ext_CLK) and the output signal of the first NAND gate N121, and an inverter I121 for inverting the output signal of the second NAND gate N122. At this time, a NAND gate may be further added between the second NAND gate N122 and the inverter I121.

FIGS. 2A to 2C show internal waveforms for explaining the process of generating the pulse in the circuit for generating the internal clock signal shown in FIG. 1.

FIG. 2A of them shows a waveform where the delay width of the pulse by the delay unit is smaller than that of the external clock signal. Referring to FIG. 2A, in the event that a delay width (DW) between the delay signal (A) delayed by the delay unit and the external clock signal (Ext_CLK) is smaller than a pulse width (PW) of the external clock signal (Ext_CLK), the internal clock signal (Int_CLK) is normally generated by the logical combination of the logical devices included in the pulse-shaping unit (120 in FIG. 1). In other words, the rising edge of the internal clock signal (Int_CLK) is synchronized to the rising edge of the external clock signal (Ext_CLK). Meanwhile, the pulse width of the internal clock signal (Int_CLK) is set to the delay width (DW) between the delay signal (A) delayed by the delay unit and the external clock signal (Ext_CLK). Therefore, the pulse width of the internal clock signal (Int_CLK) can be controlled by adjusting the degree of delay of the delay unit.

Further, FIG. 2B shows a waveform where the delay width of the pulse by the delay unit is coincident with the pulse width of the external clock signal. Referring to FIG. 2B, in case that the delay width (DW) between the delay signal (A) delayed by the delay unit and the external clock signal (Ext_CLK) is coincident with the pulse width (PW) of the external clock signal (Ext_CLK), the internal clock signal (Int_CLK) is normally generated by the logical combination of the logical devices included in the pulse-shaping unit (120 in FIG. 1). In other words, the rising edge of the internal clock signal (Int_CLK) is synchronized to the rising edge of the external clock signal (Ext_CLK). Further, in this case, the pulse width (PW) of the external clock signal (Ext_CLK) is set to the pulse width of the internal clock signal (Int_CLK) as it is.

Meanwhile, in the event that the delay width (DW) between the delay signal (A) delayed by the delay unit and the external clock signal (Ext_CLK) is greater than the pulse width (PW) of the external clock signal (Ext_CLK), a problem may take place.

FIG. 2C shows a waveform, in which the delay width of the pulse by the delay unit is greater than the pulse width of the external clock signal. Referring to FIG. 2B, in case that the delay width (DW) between the delay signal (A) delayed by the delay unit and the external clock signal (Ext_CLK) is greater than the pulse width (PW) of the external clock signal (Ext_CLK), the internal clock signal (Int_CLK) is abnormally generated by the logical combination of the logical devices included in the pulse-shaping unit (120 in FIG. 1). In other words, the rising edge of the internal clock signal (Int_CLK) is not synchronized to the rising edge of the external clock signal (Ext_CLK) and a time point where the internal clock signal (Int_CLK) is enabled according to the frequency of the external clock signal (Ext_CLK) (time point where the rising edge takes place) is differentiated. Further, the pulse width of the internal clock signal (Int_CLK) is set to the width of a High-level portion of the pulse delayed by the delay unit and a portion in which the High level of the external clock signal (Ext_CLK) is not overlapped., The pulse width of the internal clock signal (Int_CLK) can be abruptly reduced depending on the operating frequency (for example, the external clock signal).

As such, if the time point where the internal clock signal is enabled (for example, the rising edge) is changed depending on the frequency of the external clock signal and the pulse width is abruptly reduced, the operating margin within the circuit is reduced to cause malfunction. This degrades reliability of the circuit and may cause fail even worse.

SUMMARY OF THE INVENTION

The present invention is directed to a circuit and a method for generating an internal clock signal that can be used in a high frequency and a low frequency at the same time and can improve reliability of the circuit, in such a way that it is determined whether the external clock signal is the high frequency or the low frequency and the external clock signal is then waveform-shaped to generate the internal clock signal depending on the determination, or the external clock signal as the internal clock signal as it is, thereby making coincident rising edge timings of an external clock signal and an internal clock signal regardless of a frequency of the external clock signal and preventing reduction in an operating margin within the circuit due to reduction in a pulse width of the internal clock signal.

According to a preferred embodiment of the present invention, there is provided a circuit for generating an internal clock signal, including an operating frequency decision unit for determining whether an external clock signal is a low frequency or a high frequency, and an internal clock signal generator for waveform-shaping the external clock signal and generating an internal clock signal depending on the output of the operating frequency decision unit, or generating the external clock signal as the internal clock signal as it is.

In the aforementioned of circuit for generating an internal clock signal according to another embodiment of the present invention, the operating frequency decision unit generates a high frequency to determine whether the external clock signal is the high frequency or the low frequency depending on a CAS latency. At this time, the CAS latency has a value of 0 to 7 and the operating frequency decision unit generates the high frequency if the value of the CAS latency is over 4. Meanwhile, the circuit further includes a mode register for storing the CAS latency.

The internal clock signal generator includes a delay unit for delaying the external clock signal by some time, and a pulse-shaping unit for logically combining the external clock signal with the output of the delay unit and generating the internal clock signal depending on the output of the operating frequency decision unit, or generating the external clock signal as the internal clock signal as it is. At this time, the internal clock signal has the same pulse width as that of the external clock signal or has the pulse width corresponding to delay time of the delay unit.

The pulse-shaping unit includes a first NAND gate for logically combining the external clock signal with the output signal of the delay unit depending on the output of the operating frequency decision unit, a second NAND gate into which the external clock signal and the output signal of the first NAND gate are inputted, and an inverter for inverting the output signal of the second NAND gate.

The delay unit includes a RC delay circuit. The delay unit includes a first inverter for inverting the external clock signal, a number of resistors serially connected between the output of the first inverter and a first node, a number of MOS capacitors connected between the first node and a ground, and a second inverter connected between the first node and an output terminal. Further, the circuit further includes first fuses connected to both ends of the number of the resistors, respectively, wherein the first fuses can be blown, and second fuses connected to the first nodes and the number of the MOS capacitors, respectively, wherein the second fuses can be blown.

One aspect of the present invention is to provide a method of generating an internal clock signal, including the steps of determining whether an external clock signal is a low frequency or a high frequency, and waveform-shaping the external clock signal and generating an internal clock signal depending on the result of the determination step, or generating the external clock signal as the internal clock signal as it is.

In the aforementioned of method of generating an internal clock signal according to another embodiment of the present invention, in the determination step, whether the external clock signal is the high frequency or the low frequency is determined as CAS latency. At this time, the CAS latency has a value of 0 to 7 and the external clock signal is determined as the high frequency if the value of the CAS latency is over 4.

The step of generating the clock includes the steps of waveform-shaping the external clock signal and generating the internal clock signal if the external clock signal is the low frequency, and generating the external clock signal as the internal clock signal as it is if the external clock signal is the high frequency.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 3:
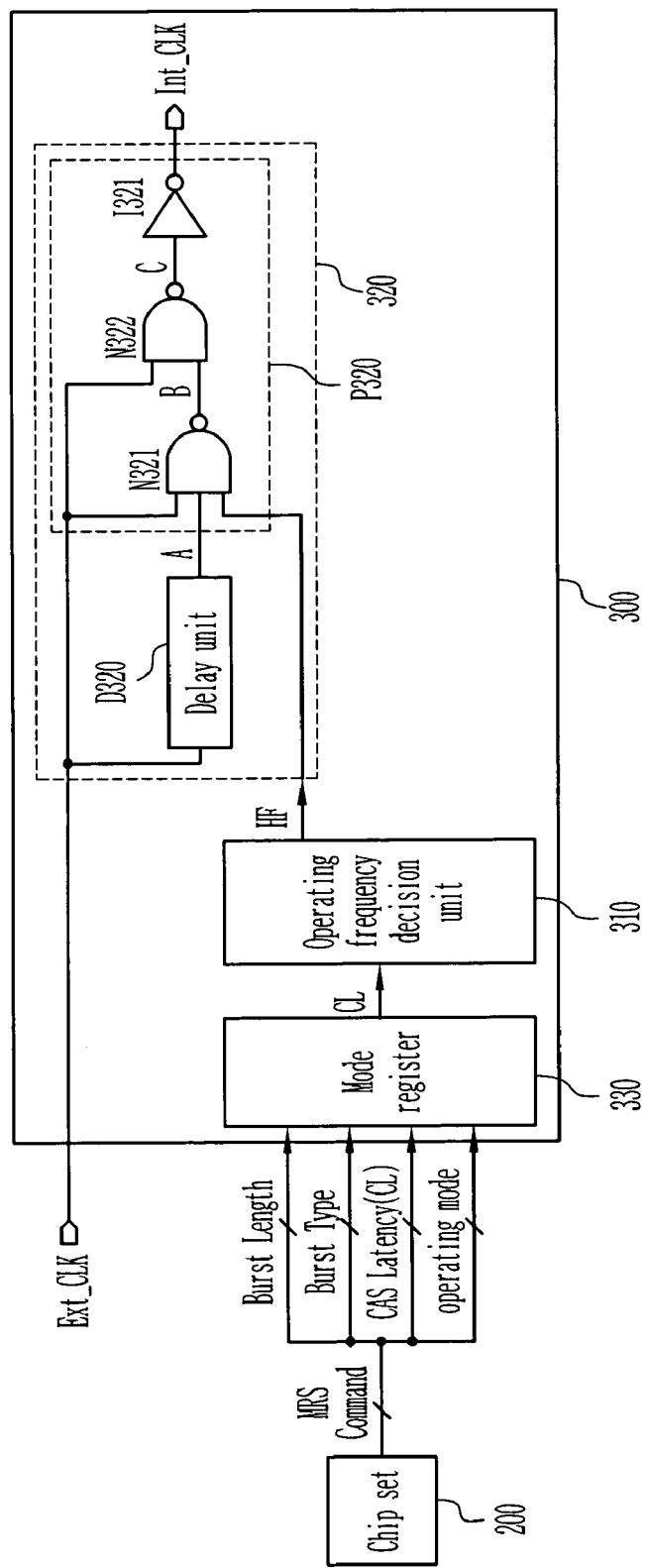
FIG. 3 is a circuit diagram illustrating a circuit for generating an internal clock signal according to an embodiment of the present invention.

FIG. 3 is a circuit diagram illustrating a circuit for generating an internal clock signal according to an embodiment of the present invention.

Referring to FIG. 3, the circuit for generating the internal clock signal included in a semiconductor memory device 300 may be implemented using an operating frequency decision unit 310 and an internal clock signal generator 320.

In the above, the operating frequency decision unit 310 generates a detecting signal (HF) depending on the operating frequency (for example, the frequency of the external clock signal) of the semiconductor memory device 300. If the external clock signal (Ext_CLK) corresponds to the HF since it is higher than a given frequency, the operating frequency decision unit 310 activates the HF (defined as a Low level in the present embodiment). The internal clock signal generator 320 waveform-shapes the external clock signal (Ext_CLK) depending on the detecting signal (HF) to generate the internal clock signal (Int_CLK), or generates the external clock signal (Ext_CLK) as the internal clock signal (Int_CLK) as it is. At this time, if the external clock signal (Ext_CLK) corresponds to a low frequency, the internal clock signal generator 320 waveform-shapes the external clock signal (Ext_CLK) to generate the internal clock signal (Int_CLK). If the external clock signal (Ext_CLK) corresponds to the high frequency, the internal clock signal generator 320 generates the external clock signal (Ext_CLK) as the internal clock signal (Int_CLK) as it is. Meanwhile, the waveform shaping of the external clock signal (Ext_CLK) can be accomplished by logically combining the external clock signal (Ext_CLK) and the delay signal (A) of the external clock signal (Ext_CLK).

As in the above, the operating frequency decision unit 310 determines whether the external clock signal (Ext_CLK) inputted to the semiconductor memory device 300 is the high frequency or the low frequency (for example, in case of about 100 MHz, it is the low frequency, and in case of over 500 MHz, it is the high frequency). If the external clock signal (Ext_CLK) is higher than a given frequency, the operating frequency decision unit 310 activates the high frequency. Whether the external clock signal (Ext_CLK) is the high frequency or not could be determined through several methods and constructions accordingly.

For example, before the memory device 300 is operated, a mode register set command (MRS command) including signals such as a burst length, a burst type, a column address strobe (GAS) latency and an operating mode is inputted from an external chip set 200, thus deciding the operating mode of the memory device 300. The MRS command is stored at a mode register 330 provided in the memory device 300. At this time, whether the detecting signal (HF) has been activated may be decided on the basis of the data for the CAS latency of the MRS command that is inputted from the external chip set 200 and stored at the mode register 330. The CAS latency indicates time latency from a command to output data of a given page is issued until the output is actually performed when any memory cell (page or address block) is activated.

Generally, the data for the CAS latency consists of 3 bits. As such, the data is composed of the 3 bits, it may have a value from 0 to 7 (000 to 111) depending on the frequency of the external clock signal, as shown in Table 1. At this time, the operating frequency decision unit 310 can determine whether the external clock signal is the high frequency or the low frequency with the data for the CAS latency.

Figure 4:
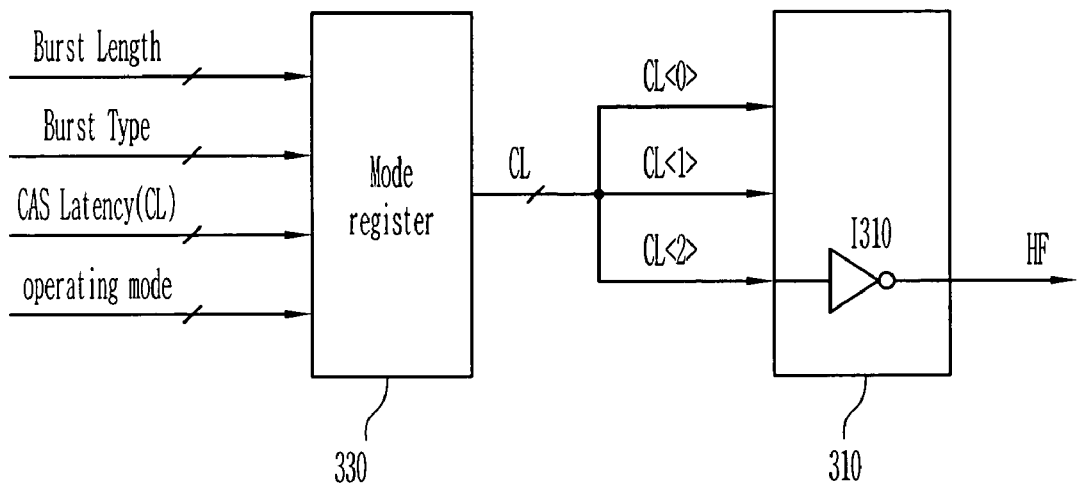
FIG. 4 is a circuit diagram for explaining an embodiment of the operating frequency decision unit shown in FIG. 3.

For example, if the data for the CAS latency is over 4 (100 to 111), it may be set to activate the detecting signal (HF) considering that the external clock signal is the high frequency. In this case, if the data for the CAS latency is over 4 bit, the most significant bit (CL>2<) is always '1' of the data of the 3 bits (CL>0< to CL>2<). Thus, as shown in FIG. 4, the operating frequency decision unit 310 can be implemented only using an inverter I310 for inverting the level of the most significant bit (CL>2<) so that the detecting signal (HF) becomes activated (Low level) only when the most significant bit is '1' as a result of sensing only the most significant bit (CL>2<).

TABLE 1

| CL<2> | CL<1> | CL<0> | CL Data Value |
|---|---|---|---|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

For example, in case that the detecting signal (HF) is outputted by sensing only the data value of the most significant bit (CL>2<), it is possible to implement the operating frequency decision unit 310 using only the inverter for inverting the data of the most significant bit (CL>2<).

In addition to the above, the basic frequency for deciding whether the external clock signal is the high frequency through the logical combination using the data for the CAS latency.

Meanwhile, though not shown in the drawings, a frequency sensing means (not shown) of the external clock signal (Ext_CLK) may be located within the memory device 300. The frequency sensing means compares the frequency of the external clock signal (Ext_CLK) that is externally inputted with the basic frequency to determine whether the frequency of the external clock signal is the high frequency or the low frequency and may activate the detecting signal (HF) only when the external clock signal is the high frequency as a result of the determination.

The internal clock signal generator 320 generates the internal clock signal (Int_CLK) using the external clock signal (Ext_CLK) and, it is determined whether to generate the internal clock signal (Int_CLK) for the low frequency by transforming the external clock signal (Ext_CLK) depending on the detecting signal (HF), or to use the external clock signal (Ext_CLK) as the internal clock signal (Int_CLK) for the high frequency as it is.

Such internal clock signal generator 320 may include a delay unit D320 for delaying the external clock signal (Ext_CLK) by some time to generate the delay signal (A), and a pulse-shaping unit P320 for logically combining the external clock signal (Ext_CLK) and the delay signal (A) to generate the internal clock signal (Int_CLK) for the low frequency or transmit the external clock signal (Ext_CLK) as the internal clock signal (Int_CLK) for the high frequency as it is if the detecting signal (HF) is activated.

Figure 5:
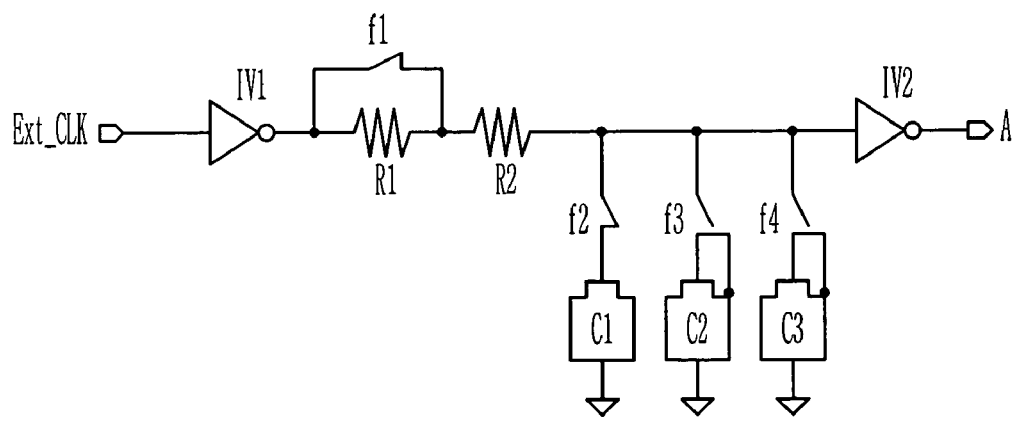
FIG. 5 is a circuit diagram for explaining an embodiment of the delay unit shown in FIG. 3.

In the above, the delay unit D320 may include a plurality of inverters (only two; IV1, IV2 are shown in the drawing) that are serially connected, for delaying the external clock signal (Ext_CLK) by some delay and then transferring the resulting signal to an inverter connected in a next stage, a plurality of resistors (only two; R1, R2 are shown in the drawing) that are serially connected between the two inverters IV1 and IV2, and a plurality of MOS capacitors (only three; C1, C2, C3 are shown in the drawing) that are serially in parallel connected between the output terminal of the resistor R2 connected to the final stage of the plurality of the resistors R1 and R2 and the ground terminal, as shown in FIG. 5. The plurality of the resistors R1 and R2 and the MOS capacitors C1, C2, C3 additionally include fuses f1, f2, f3 and f4 that are in parallel connected between respective connecting nodes, so that the connection is selectively controlled depending on blowing of these fuses.

The delay unit constructed above increases the pulse width if the fuses f1 connected to the resistor is disconnected, while reducing the pulse width if the fuses f2 connected to the MOS capacitor is disconnected. By selectively connecting the resistors and the MOS capacitors connected to the respective fuses by the fuse-blowing mode, it is possible to control the degree of delay accordingly.

Meanwhile, the pulse-shaping unit P320 may include a first logical means N321 to which the external clock signal (Ext_CLK), the delay signal (A) and the detecting sianal (HF) are inputted, and a second logical means N322 to which the external clock signal (Ext_CLK) and the output signal of the first logical means N321 are inputted. At this time, if the first logical means N321 or the second logical means N322 consists of a NAND gate, an inverter I321 for inverting the output signal of the second logical means N322 is further installed at the output terminal of the second logical means N322. Meanwhile, though only a single logical means N322 is installed between the first logical means N321 and the inverter I312 in the drawing, the number of the logical means N322 may be different depending on the case.

Figure 1:
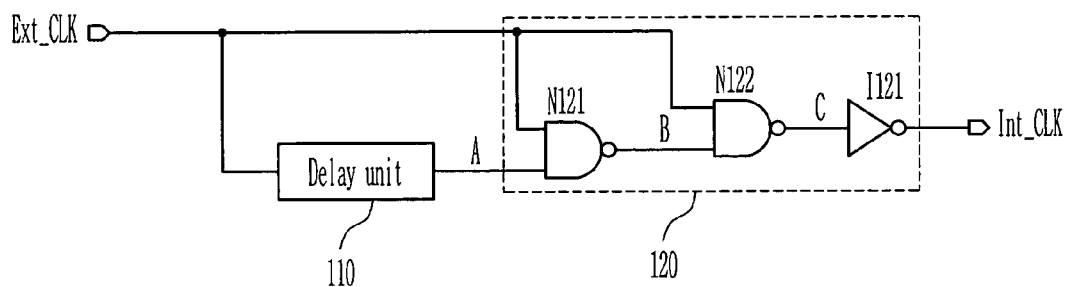
FIG. 1 is a circuit diagram illustrating a circuit for generating an internal clock signal according to a prior art.
Figure 2A:
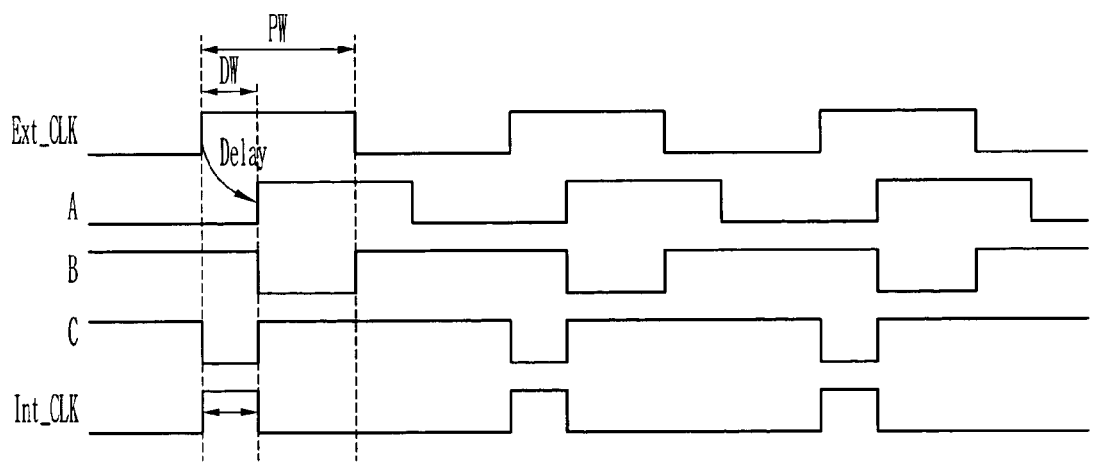
FIGS. 2A to 2C show internal waveforms for explaining the process of generating the pulse in the circuit for generating the internal clock signal shown in FIG. 1.
Figure 2B:
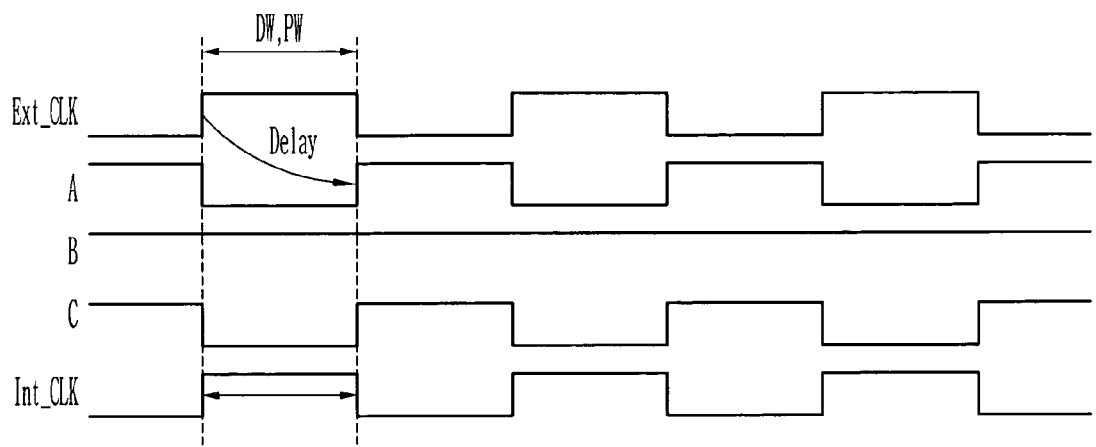
Figure 2C:
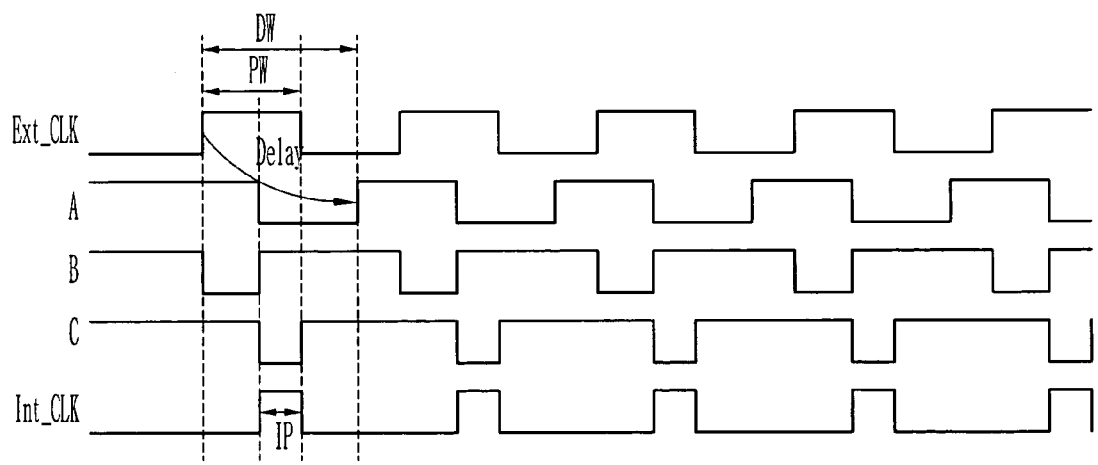

How the internal clock signal generator 320 constructed above operates depending on the detecting signal (HF) will now be descried with reference to the waveform. At this time, if the external clock signal is a low frequency, since the detecting signal (HF) is generated as a High level (inactive) and thus does not give influence on the operation of the first logical means N321, the internal waveform of the internal clock signal generator 320 is same as that of FIGS. 2A and 2B. At this time, the internal clock signal (Int_CLK) is used when the external clock signal (Ext_CLK) is the low frequency. The internal clock signal (Int_CLK) has a pulse width corresponding to the delay time of the delay unit D320.

Figure 6:
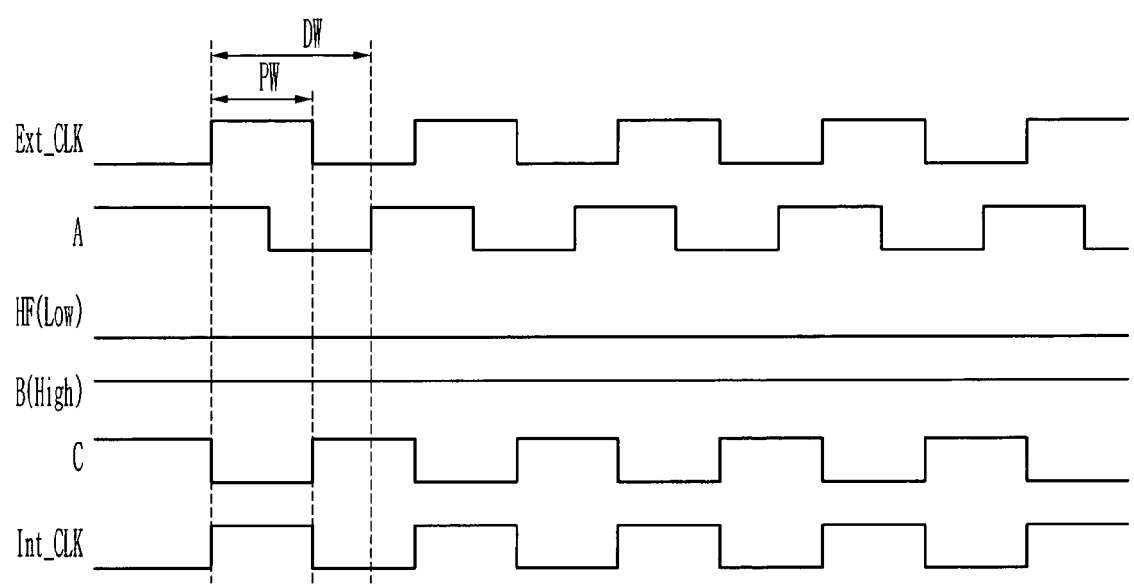
FIG. 6 show internal waveforms for explaining the process of generating the pulse in the circuit for generating the internal clock signal shown in FIG. 3.

However, if the external clock signal corresponds to a high frequency and the detecting signal (HF) is thus activated as a Low level, they operate quite differently. FIG. 6 show internal waveforms for explaining the process of generating the pulse in the circuit for generating the internal clock signal shown in FIG. 3.

Referring to FIGS. 3 and 6, if the external clock signal becomes a high frequency, the delay width (DW) between the delay signal (A) delayed by the delay unit D320 and the external clock signal (Ext_CLK) becomes higher than the pulse width (PW) of the external clock signal (Ext_CLK), which may cause a problem. If the external clock signal becomes a high frequency, however, the HF is activated to be a Low level, while the first logical means N321 becomes a disable state to always output the signal of the High level regardless of the delay signal (A) of the delay unit D320. Therefore, a logical combination of the external clock signal (Ext_CLK) and the delay signal (A) is not performed and the external clock signal (Ext_CLK) are outputted through the second logical means N322 and the inverter I321 as it is. At this time, the external clock signal (Ext_CLK) may be a little delayed by the second logical means N322 and the inverter I321 and the degree of delay is negligible.

As described above, when the external clock signal is the high frequency, since the external clock signal (Ext_CLK) is outputted as the internal clock signal (Int_CLK) for the high frequency, a problem that the pulse width of the internal clock signal (Int_CLK) is abruptly reduced or a problem that the rising edge is not synchronized can be prevented. It is therefore possible to increase the operating margin and reliability of the circuit.

According to the present invention, if an external clock signal is a low frequency, an internal clock signal for a low frequency is generated using the external clock signal and a delay signal that delayed the external clock signal. If the external clock signal is a high frequency, the external clock signal is outputted as the internal clock signal for the high frequency as it is. Rising edge time of the external clock signal and the internal clock signal is synchronized regardless of the frequency of the external clock signal and reduction in the operating margin within the circuit due to reduction in the pulse width of the internal clock signal is prevented. It is thus possible to improve reliability of the circuit while the present invention can be used in the high frequency and the low frequency at the same time.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A circuit for generating an internal clock signal, comprising:
    an operating frequency decision unit for determining whether an external clock signal is a low frequency or a high frequency depending on a column address strobe (CAS) latency and outputting an detecting signal;
    an internal clock signal generator for generating an internal clock signal or outputting the external clock signal as the internal clock signal, the internal clock signal generator comprising:
        a delay unit for delaying the external clock signal by some time; and
        a pulse-shaping unit for logically combining the external clock signal with the output of the delay unit and generating the internal clock signal depending on the detecting signal of the operating frequency decision unit, or generating the external clock signal as the internal clock signal as it is.

2. The circuit as claimed in claim 1, wherein the operating frequency decision unit comprises an inverter for inverting a level of a most significant bit of the CAS latency.

3. The circuit as claimed in claim 1, wherein the CAS latency has a value of 0 to 7 and the operating frequency decision unit generates the detecting signal if the value of the CAS latency is over 4.

4. The circuit as claimed in claim 1, further comprising a mode register for storing the CAS latency.

5. The circuit as claimed in claim 1, wherein the pulse-shaping unit comprises:
    a first NAND gate for logically combining the external clock signal with the output signal of the delay unit depending on the detecting signal of the operating frequency decision unit;
    a second NAND gate into which the external clock signal and the output signal of the first NAND gate are inputted; and
    an inverter for inverting the output signal of the second NAND gate.

6. The circuit as claimed in claim 1, wherein the internal clock signal has the same pulse width as that of the external clock signal or has the pulse width corresponding to delay time of the delay unit.

7. The circuit as claimed in claim 1, wherein the delay unit comprises:
    a first inverter for inverting the external clock signal; a number of resistors serially connected between the output of the first inverter and a first node;
    a number of MOS capacitors connected between the first node and a ground; and
    a second inverter connected between the first node and an output terminal.

8. The circuit as claimed in claim 7, wherein the delay unit further comprises:
    first fuses connected in parallel to the resistors, respectively, and can be blown; and
    second fuses connected in parallel to the MOS capacitors, respectively, and can be blown.

9. The circuit as claimed in claim 1, wherein the delay unit includes a RC delay circuit.

10. The circuit as claimed in claim 9, wherein the delay unit comprises:
    a first inverter for inverting the external clock signal; a number of resistors serially connected between the output of the first inverter and a first node;
    a number of MOS capacitors connected between the first node and a ground; and
    a second inverter connected between the first node and an output terminal.

11. The circuit as claimed in claim 10, wherein the delay unit further comprises:
    first fuses connected in parallel to the resistors, respectively, and can be blown; and
    second fuses connected in parallel to the MOS capacitors, respectively, and can be blown.

12. A circuit for generating an internal clock signal, comprising:

an operating frequency decision unit for determining whether an external clock signal is a low frequency or a high frequency depending on a column address strobe (CAS) latency and outputting an detecting signal;

an internal clock signal generator for waveform-shaping the external clock signal and generating an internal clock signal depending on the detecting signal of the operating frequency decision unit, or generating the external clock signal as the internal clock signal as it is, the internal clock signal generator comprising:

a delay unit for delaying the external clock signal by some time; and a pulse-shaping unit for logically combining the external clock signal with the output of the delay unit and generating the internal clock signal depending on the output detecting signal of the operating frequency decision unit, or generating the external clock signal as the internal clock signal as it is, the pulse-shaping unit comprising a first NAND gate for logically combining the external clock signal with the output signal of the delay unit depending on the detecting signal of the operating frequency decision unit, a second NAND gate into which the external clock signal and the output signal of the first NAND gate are inputted, and an inverter for inverting the output signal of the second NAND gate.

13. A method of generating an internal clock signal, comprising the steps of:

determining whether an external clock signal is a low frequency or a high frequency depending on a column address strobe (CAS) latency; and waveform-shaping the external clock signal and generating an internal clock signal if the external clock signal is the low frequency, or outputting the internal clock signal having the same pulse width and the same frequency as the external clock signal if the external clock signal is the high frequency, depending on a result of the determination step.

14. A method of generating an internal clock signal, comprising the steps of:

determining whether an external clock signal is a low frequency or a high frequency depending on a column address strobe (CAS) latency; and waveform-shaping the external clock signal and generating an internal clock signal depending on a result of the determination step, or generating the external clock signal as the internal clock signal as it is, wherein the CAS latency has a value of 0 to 7 and the external clock signal is determined as the high frequency if the value of the CAS latency is over 4.

15. A method of generating an internal clock signal, comprising the steps of:

determining whether an external clock signal is a low frequency or a high frequency depending on a column address strobe (CAS) latency;

generating a delayed external clock signal by delaying the external clock signal by some time; and waveform-shaping the external clock signal using the delayed external clock signal and generating an internal clock signal depending on a result of the determination step, or generating the external clock signal as the internal clock signal as it is, wherein the step of generating the clock comprises the steps of:

waveform-shaping the external clock signal by logically combining the external clock signal with the delayed external clock signal and generating the internal clock signal if the external clock signal is the low frequency; and generating the external clock signal as the internal clock signal as it is if the external clock signal is the high frequency.

16. A circuit for generating an internal clock signal, comprising:

an operating frequency decision unit for outputting a detecting signal which indicates whether an external clock signal is a low frequency or a high frequency in response to a column address strobe (CAS) latency; and an internal clock signal generator for generating an internal clock signal by waveform-shaping the external clock signal, or for outputting the external clock signal as the internal clock signal so that the internal clock signal has the same pulse width and the same frequency as the external clock signal, in response to the detecting signal.

17. The circuit as claimed in claim 16, wherein the operating frequency decision unit comprises an inverter for inverting a level of a most significant bit of the CAS latency.

18. The circuit as claimed in claim 16, wherein the internal clock signal generator comprises:

a delay unit for delaying the external clock signal by some time;

a first NAND gate for logically combining the external clock signal with the output signal of the delay unit depending on the detecting signal of the operating frequency decision unit;

a second NAND gate into which the external clock signal and the output signal of the first NAND gate are inputted; and an inverter for inverting the output signal of the second NAND gate.

* * * * *